US012538801B2

(12) United States Patent
Danov et al.

(10) Patent No.: US 12,538,801 B2
(45) Date of Patent: Jan. 27, 2026

(54) SEMICONDUCTOR ASSEMBLY COMPRISING A FIRST SEMICONDUCTOR ELEMENT AND A FIRST CONNECTION ELEMENT

(71) Applicant: Siemens Aktiengesellschaft, Munich (DE)

(72) Inventors: Vladimir Danov, Erlangen (DE); Philipp Kneissl, Nuremberg (DE); Volker Müller, Nuremberg (DE); Stephan Neugebauer, Erlangen (DE); Florian Schwarz, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/839,996

(22) PCT Filed: Jan. 30, 2023

(86) PCT No.: PCT/EP2023/052151
§ 371 (c)(1),
(2) Date: Aug. 20, 2024

(87) PCT Pub. No.: WO2023/160949
PCT Pub. Date: Aug. 31, 2023

(65) Prior Publication Data
US 2025/0112118 A1 Apr. 3, 2025

(30) Foreign Application Priority Data

Feb. 23, 2022 (EP) .................... 22158230
Mar. 22, 2022 (EP) .................... 22163532

(51) Int. Cl.
*H01L 23/40* (2006.01)
*H01L 21/48* (2006.01)
*H01L 23/427* (2006.01)

(52) U.S. Cl.
CPC ...... *H01L 23/4006* (2013.01); *H01L 21/4882* (2013.01); *H01L 23/427* (2013.01); *H01L 2023/405* (2013.01); *H01L 2023/4087* (2013.01)

(58) Field of Classification Search
CPC ............. H01L 23/4006; H01L 21/4882; H01L 23/427; H01L 2023/405; H01L 2023/4087;
(Continued)

(56) References Cited

U.S. PATENT DOCUMENTS

2004/0060965 A1\* 4/2004 Mishra ............... B23K 20/1255
228/2.1
2008/0224303 A1\* 9/2008 Funakoshi ............ H01L 23/473
257/E23.088
(Continued)

FOREIGN PATENT DOCUMENTS

DE 102008063724 B4 8/2012
DE 202013105494 U1 3/2014
(Continued)

OTHER PUBLICATIONS

Mehta Kush P. et al: "A review on friction stir-based channeling", Critical Reviews in Solid State and Materials Sciences, Bd. 47, Nr. 1, Feb. 28, 2021 (Feb. 28, 2021), pages; pp. 1-45, XP055960320, US ISSN: 1040-8436, DOI:10.1080/10408436.2021.1886042; 2021.
(Continued)

*Primary Examiner* — Patricia D Valenzuela
(74) *Attorney, Agent, or Firm* — Henry M. Feiereisen LLC

(57) ABSTRACT

A semiconductor assembly includes a semiconductor element designed as a power semiconductor module and comprising a contact, and a connection element designed as a busbar which is connected to the contact of the power
(Continued)

semiconductor module via a force-fit connection, in particular a screw connection. The busbar includes a cover plate and a closed cooling channel structure with a cooling channel which is produced at least partially by an FSC (Friction Stir Channeling) method and arranged to run through the cover plate.

24 Claims, 6 Drawing Sheets

(58) Field of Classification Search
CPC ... H01L 21/4871; H01L 23/473; H02M 7/003
See application file for complete search history.

(56) References Cited

U.S. PATENT DOCUMENTS

| | | |
|---|---|---|
| 2020/0170111 A1 | 5/2020 | Blank et al. |
| 2022/0406682 A1 | 12/2022 | Schwarz et al. |

FOREIGN PATENT DOCUMENTS

| | | | |
|---|---|---|---|
| DE | 102019213857 A1 | 3/2021 | |
| DE | 102019134731 A1 | 6/2021 | |
| EP | 2597676 A2 | 5/2013 | |
| EP | 3428964 A1 | 1/2019 | |
| EP | 3823018 A1 | 5/2021 | |
| EP | 3832714 A1 | 6/2021 | |
| JP | 2013115907 A | 6/2013 | |
| WO | WO 2006058860 A2 | 6/2006 | |
| WO | WO 2013151606 A1 | 10/2013 | |
| WO | WO 2020249479 A1 | 12/2020 | |

OTHER PUBLICATIONS

Filgueiras Miguel et al: "Friction Stir Channeling Industrial Applications Prototype Design and Production Mechanical Engineering Jury", claims 1-5,7, 14,15 Classification of the Registration {IPC) May 1, 2012 (May 1, 2012), XP055960747, found on the Internet: URL:https:/scholar.tecnico.ulisboa.pt/api/records/RK3cXS_vY315TE4Mw2kAQeipgZ6qdyih05Zn/file/aad042893e272f56466cabe8cb0453daciff2b611d0624b15fbb0058240ba846.pdf; [gefunden am Sep. 14, 2022]* das ganze Dokument*; 2012.

PCT International Search Report and Written Opinion of International Searching Authority mailed May 25, 2023 corresponding to PCT International Application No. PCT/EP2023/052151 filed Sep. 30, 2023.

* cited by examiner

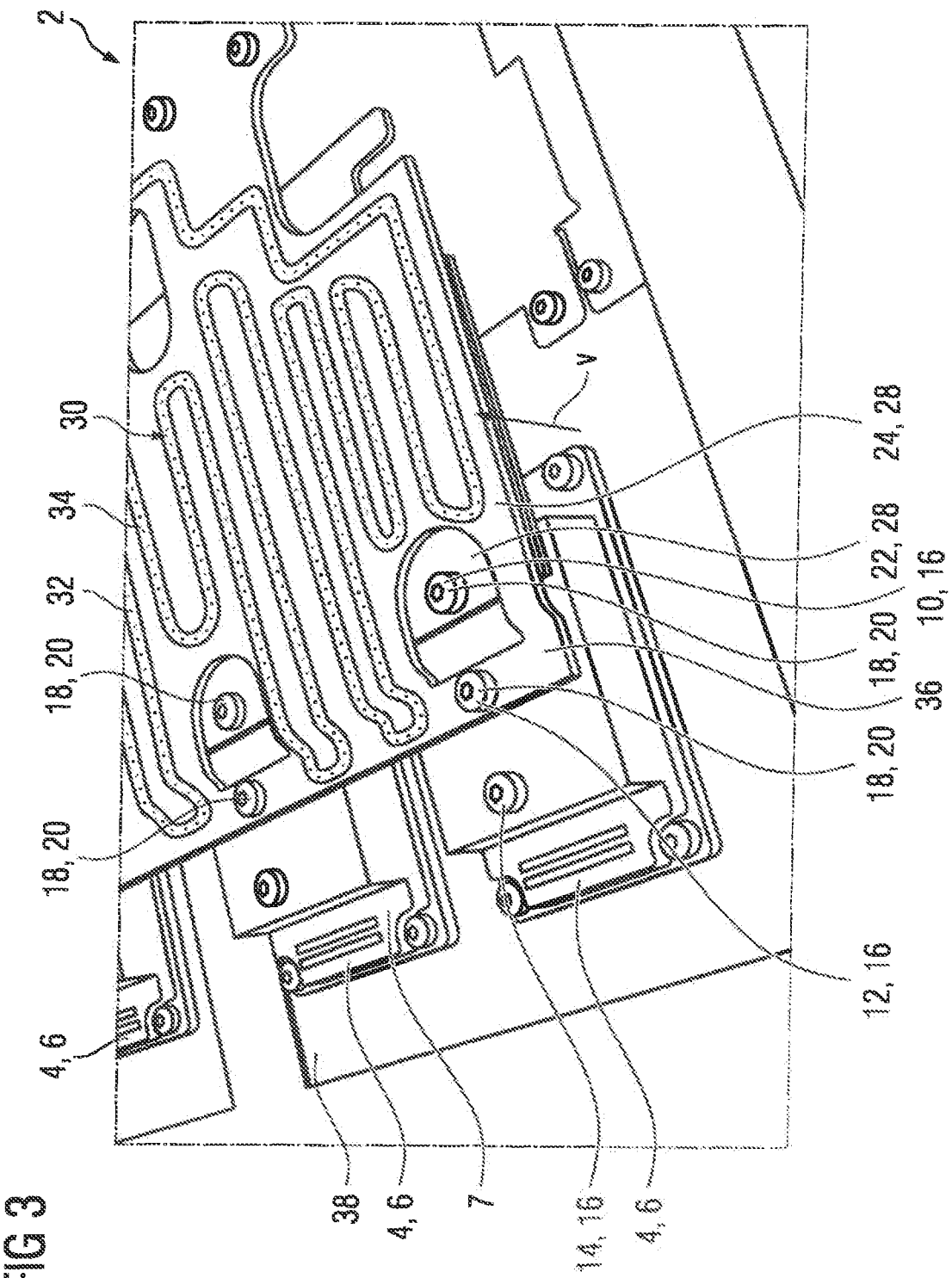

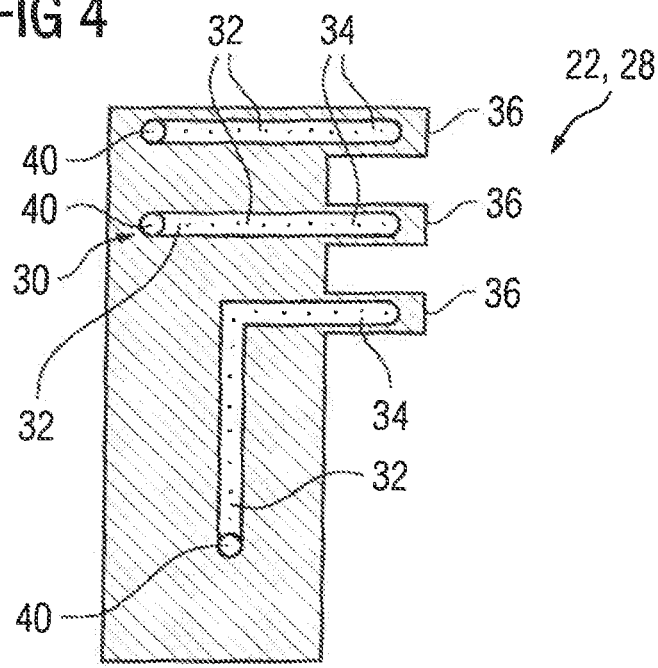
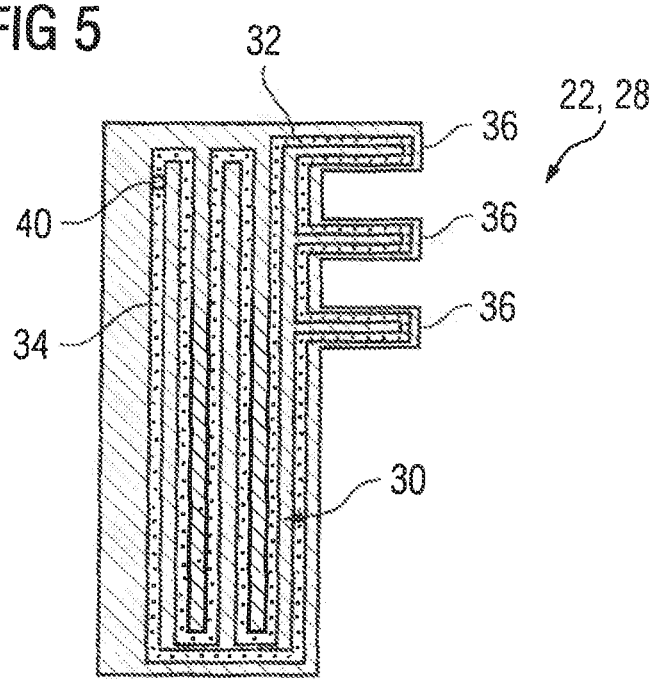

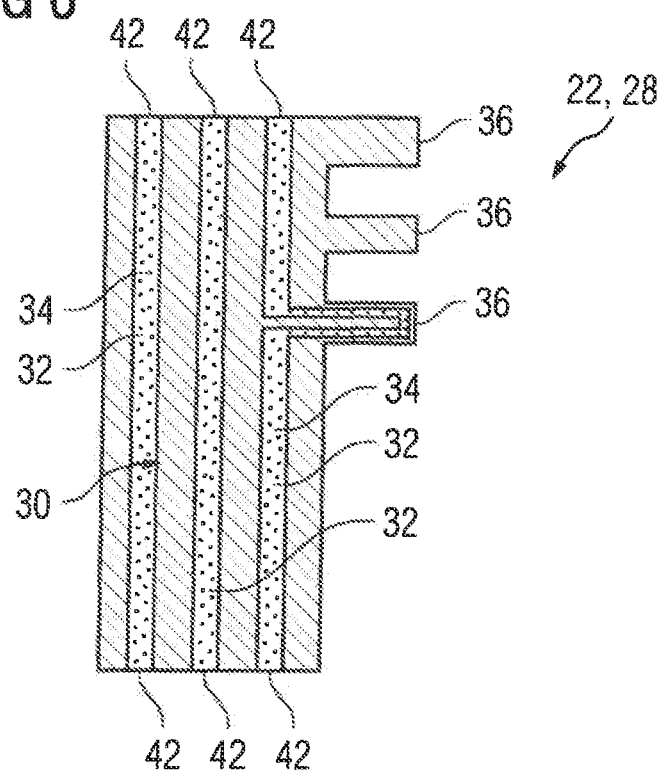
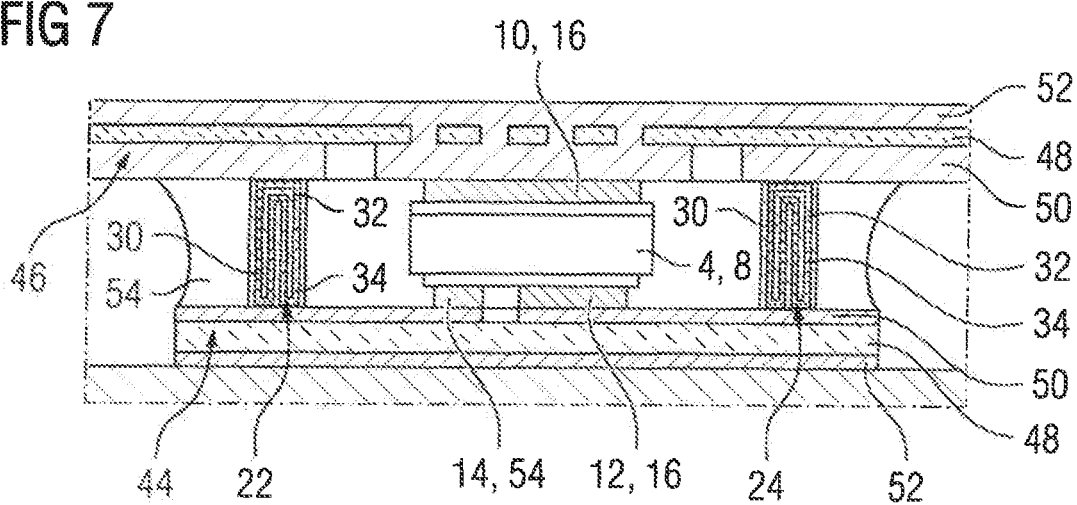

SEMICONDUCTOR ASSEMBLY COMPRISING A FIRST SEMICONDUCTOR ELEMENT AND A FIRST CONNECTION ELEMENT

CROSS-REFERENCES TO RELATED APPLICATIONS

This application is the U.S. National Stage of International Application No. PCT/EP2023/052151, filed Jan. 30, 2023, which designated the United States and has been published as International Publication No. WO 2023/160949 A1 and which claims the priorities of European Patent Applications, Ser. No. 22/158,230.7, filed Feb. 23, 2022 and Ser. No. 22/163,532.9, filed Mar. 22, 2022, pursuant to 35 U.S.C. 119 (a)-(d).

BACKGROUND OF THE INVENTION

The Invention relates to a semiconductor assembly comprising a semiconductor element and at least one connection element, wherein the semiconductor element has at least one contact, wherein at least one connection element is connected to a contact of the semiconductor element, wherein the semiconductor element is designed as a power semiconductor module, wherein the connection element is designed as a busbar which is connected to the contact of the power semiconductor module via a force-fit connection, in particular a screw connection.

The invention further relates to a semiconductor assembly comprising a semiconductor element and at least one connection element, wherein the semiconductor element has at least one contact, wherein at least one connection element is connected to a contact of the semiconductor element, wherein the semiconductor element is designed as a power semiconductor which is arranged between a first substrate and a second substrate and is connected at least to the first substrate, in particular in a material-bonded manner.

The invention further relates to a power converter with at least one semiconductor assembly as claimed in one of the preceding claims.

The invention additionally relates to a method for producing a semiconductor assembly comprising a semiconductor element and at least one connection element, wherein the semiconductor element has at least one contact, wherein at least one connection element is connected to a contact of the semiconductor element, wherein the semiconductor element is designed as a power semiconductor module, wherein the connection element is designed as a busbar which is connected to the contact of the power semiconductor module via a force-fit connection, in particular a screw connection.

The Invention additionally relates to a method for producing a semiconductor assembly comprising a semiconductor element and at least one connection element, wherein the semiconductor element has at least one contact, wherein at least one connection element is connected to a contact of the semiconductor element, wherein the semiconductor element is designed as a power semiconductor which is arranged between a first substrate and a second substrate and is connected at least to the first substrate, in particular in a material-bonded manner.

Such assemblies are employed for example in a power converter. A power converter should be understood for example to mean a rectifier, an inverter, a converter or a DC/DC converter. The semiconductor assemblies in a power converter are normally implemented in the form of power semiconductor modules which are contacted for example by means of busbars. For example, by using planar mounting and connection technology it is possible inter alia to achieve increased miniaturization.

The published patent application WO 2020/249479 A1 describes an electronic circuit having a first and a second circuit carrier and a first and a second semiconductor element. The first semiconductor element lies with its upper side on an underside of the first circuit carrier and with its underside on an upper side of the second circuit carrier. The first circuit carrier has a first via which connects the first semiconductor element to a first conducting path. The first circuit carrier has a second via which electrically connects a connection element arranged between the circuit carriers to a further conducting path. A material-bonded connection is produced between the circuit carriers via the first connection element. The second semiconductor element lies on the underside of the first circuit carrier and is electrically connected to the first or second conducting path.

Due to the increasing miniaturization of the power electronics in power converters, in particular using such planar mounting and connection technology, new challenges arise in respect of cooling a semiconductor assembly, in order to ensure a high degree of reliability with a small space requirement, while also taking production costs into account.

The published patent application EP 3 823 018 A1 describes an electronic module. The electronic module comprises a pulsating heat pipe with a channel structure in which a heat transfer medium is arranged, and at least one electric component which is in direct contact with the heat transfer medium and/or is connected to an electrically conductive contact element which is in direct contact with the heat transfer medium.

The printed patent specification DE 10 2008 063 724 B4 describes a busbar assembly which comprises: multiple busbars, which comprise a first DC busbar, a second DC busbar and an AC busbar provided therebetween in a vertically layered configuration; multiple power semiconductor devices, which are contacted to the multiple busbars and are mounted therebetween; wherein at least one of the busbars comprises a built-in cooling system.

The published patent application WO 2006/058860 A2 describes a heat exchange device having at least one laminated composite comprising a layer and at least one further layer, wherein a fluid channel for guiding a temperature-adjusting fluid is arranged between the layer and the further layer such that the fluid channel is delimited by both layers and at least one of the layers has a plastic film.

The publication "A review on friction stir-based channeling" by K. P. Mehta et al describes an FSC method.

The published patent application US 2004/060965 A1 describes an internal channel in a metal body for use in applications where internal fluid flow within a metal body is desired, as in a heat exchanger. The internal channel is formed in the metal body by frictionally stirring with a pin plunged into the metal body, and traversing the metal body with the pin.

The publication "Friction Stir Channeling Industrial Applications Prototype Design and Production Mechanical Engineering Jury" by M. Filgueiras et al describes an FSC method.

Against this backdrop, the object of the present invention is to specify a semiconductor assembly with improved cooling, which can be produced economically and easily.

SUMMARY OF THE INVENTION

This object is inventively achieved for a semiconductor assembly of the type mentioned in the introduction, in that the busbar has a closed cooling channel structure with at least one cooling channel which is produced at least partially by means of an FSC method, wherein the busbar at least has one cover plate, through which at least one cooling channel of the cooling channel structure is arranged to run.

The object is further inventively achieved for a semiconductor assembly of the type mentioned in the introduction, in that the connection element has a closed cooling channel structure with at least one cooling channel which is produced at least partially by means of an FSC method, wherein the connection element is connected to the contact of the power semiconductor via the first substrate, wherein the power semiconductor is in thermally conductive connection with the connection element via the first substrate.

The object is further inventively achieved by a power converter with at least one such semiconductor assembly.

The object is additionally inventively achieved for a method of the type mentioned in the introduction, in that in the busbar a closed cooling channel structure with at least one cooling channel is produced at least partially by means of an FSC method, wherein the busbar has at least one cover plate, through which at least one cooling channel of the cooling channel structure is arranged to run.

The object is additionally inventively achieved for a method of the type mentioned in the introduction, in that in the connection element a closed cooling channel structure with at least one cooling channel is produced at least partially by means of an FSC method, wherein the connection element is connected to the contact of the power semiconductor via the first substrate, wherein the power semiconductor is in thermally conductive connection with the connection element via the first substrate.

The advantages and preferred embodiments set out below in respect of the semiconductor assembly can be transferred analogously to the power converter and the production method.

The Invention is based on the consideration of increasing the reliability of a semiconductor assembly comprising a semiconductor element, in that the cooling of the semiconductor element is improved economically and easily. The semiconductor element is for example a power semiconductor module which can be arranged in a housing and has at least one contact. However, the semiconductor element can also be designed as an, in particular vertical, semiconductor, in particular as an insulated gate bipolar transistor (IGBT). At least one connection element is connected to a contact of the semiconductor element. The connection element can be made inter alia from a metallic material, a polymer or a polymer matrix and can be configured for thermally conductive contacting of the semiconductor element. For example, the connection element is designed as a busbar or as a contacting element and/or support element.

To ensure improved cooling, a cooling channel structure with at least one cooling channel is arranged in the connection element, resulting, in particular in the case of a high integration density, in a heat splay and thus in an improvement in the cooling of the at least one semiconductor element. For example, the heat arising due to the operation of the semiconductor element is dissipated to the surrounding area, in particular to the surrounding air, via thermal conduction, thermal radiation and/or convection.

The cooling channel of the cooling channel structure of the connection element is produced at least partially by means of an FSC method. The FSC method (Friction Stir Channeling) is a development of friction stir welding, in which the friction stir procedure is modified so that the material Is intentionally moved out of the mass of the workpiece, thereby forming a channel. Cooling channels can be produced easily and economically using such a method. In particular, the FSC method allows filigree cooling channels to be realized economically and precisely as close as possible to the semiconductor element in such connection elements. The FSC method enables a flexible course of the cooling channel structure as a function of the geometry of the component.

The semiconductor element is designed as a power semiconductor module, wherein the connection element is designed as a busbar which is connected to the first contact of the power semiconductor module via a force-fit connection, in particular a screw connection. Such a power semiconductor module comprises for example power semiconductors which are arranged in a housing and have, inter alia, load terminals which are contacted by means of busbars. A screw connection for contacting is reliable and has a low thermal resistance. In such busbars contacted with the load terminals, high currents can occur. Furthermore, the power semiconductors can partially be heated via the busbars. Using cooling channels arranged in the busbars it is possible to achieve an improved dissipation of the heat loss to the surrounding area, resulting in improved cooling of the semiconductor assembly.

The busbar has at least one cover plate, through which at least one cooling channel of the cooling channel structure is arranged to run. Such a cover plate can be used inter alia for contacting a load terminal of a power semiconductor module, so that the at least one cooling channel is arranged very close to the power semiconductor module, thereby enabling an improved heat transfer and thus efficient cooling.

The semiconductor element is designed as a power semiconductor which is arranged between a first substrate and a second substrate and is connected at least to the first substrate, in particular in a material-bonded manner, wherein the connection element is connected to the contact of the power semiconductor via the first substrate, wherein the power semiconductor is in thermally conductive connection to the connection element via the first substrate. Such a material-bonded connection can be, inter alia, a soldered connection and/or a sintered connection, as well as an adhesive connection, e.g. using an electrically and thermally conductive adhesive. The power semiconductor can be designed as, inter alia, a vertical power transistor, in particular as an insulated gate bipolar transistor (IGBT). Further examples of such power semiconductors are further transistor types such as field effect transistors as well as triacs, thyristors and diodes. The connection element can inter alia have the function of a contacting and support element. Improved cooling can be achieved by way of a cooling channel structure arranged in the connection element. For example, such a connection element can be employed in the region of a hotspot.

A further form of embodiment provides that the connection element has a closed cooling channel structure. Such a closed cooling channel structure has no external terminals for the supply of a heat transfer fluid during operation. Thanks to such a closed channel structure it is possible inter alia to form a thermosiphon or a heat pipe. If the closed cooling channel structure forms a closed circuit, it is possible to form a pulsating heat pipe. Since no heat transfer fluid has to be supplied or discharged via external connections during operation and thus additional components, such as a pump for example, are not required, the production and operation of a connection element with a closed cooling channel structure are easy and economical.

A further form of embodiment provides that the connection element is made from an electrically conductive material, in particular a metallic material, and is configured for electrically conductive contacting of the contact. The connection element can inter alia contain copper, aluminum, silver, gold, tin or an alloy thereof, as a result of which a good electrical and thermal connection can be produced.

A further form of embodiment provides that at least one cooling channel of the cooling channel structure is arranged to run in a meandering pattern in the connection element. A meandering cooling channel structure can be produced by means of the FSC method over a large surface area in one process step and thus easily and economically, and enables efficient cooling and heat splay.

A further form of embodiment provides that the cooling channel structure contains a heat transfer fluid. Such a fluid can be designed to be electrically conductive and electrically non-conductive. Inter alia, air, water, in particular deionized water, a water-glycol mixture, dielectric liquids and/or oils can be used. Thus a heat transfer is enabled easily and economically.

A further form of embodiment provides that the heat transfer fluid is provided for two-phase cooling. Examples of two-phase cooling are inter alia a thermosiphon, a heat pipe or a pulsating heat pipe. In particular, perfluoro-N-alkyl-morpholine is well suited as an electrically non-conductive heat transfer medium for two-phase cooling because of its high thermal conductivity, its boiling point and its dielectric properties. Thanks to such two-phase cooling, efficient cooling is enabled.

A further form of embodiment provides that the at least one cooling channel has an opening produced by means of the FSC method, wherein the opening is provided for the introduction of the heat transfer fluid. Such an opening normally arises as a by-product during the FSC method. By using the opening to introduce the heat transfer fluid, the production process is further simplified and the production costs are further cut by reducing the number of manufacturing steps.

A further form of embodiment provides that the connection element is provided for the mechanical and/or thermal connection of the substrates. In this way the number of components required and the space required for the semiconductor assembly is reduced. In particular, in the region of hotspots a heat splay can be achieved easily and economically in this way.

A further form of embodiment provides that the connection element is made from an electrically conductive material, in particular a metallic material, and is configured for the electrically conductive connection of the first substrate to the second substrate. Thanks to the high thermal conductivity of a metallic material, an efficient heat transfer can be achieved. By using the connection elements for the production of an electrically conductive connection the number of components required and the space required for the semiconductor assembly is reduced.

BRIEF DESCRIPTION OF THE DRAWING

The invention is described and explained in greater detail below on the basis of the exemplary embodiments shown in the figures, in which:

FIG. 3 shows a schematic three-dimensional representation of a third form of embodiment of a semiconductor assembly, FIG. 4 shows a schematic representation of a first form of embodiment of a busbar in a plan view, FIG. 5 shows a schematic representation of a second form of embodiment of a busbar in a plan view, FIG. 6 shows a schematic representation of a third form of embodiment of a busbar in a plan view.

FIG. 7 shows a schematic cross-sectional representation of a fourth form of embodiment of a semiconductor assembly.

DETAILED DESCRIPTION OF PREFERRED EMBODIMENTS

Figure 1:
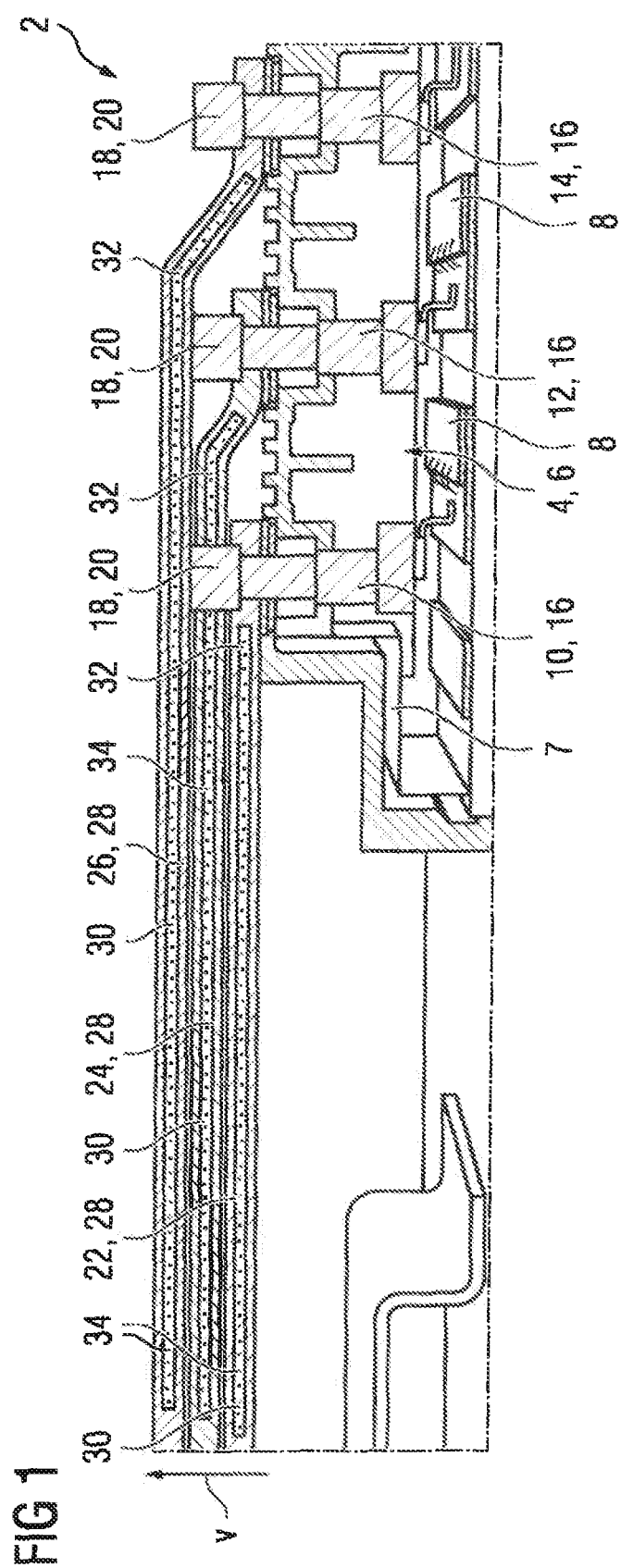
FIG. 1 shows a schematic cross-sectional representation of a first form of embodiment of a semiconductor assembly.

The exemplary embodiments explained below are preferred forms of embodiment of the invention. In the exemplary embodiments the described components of the forms of embodiment each represent individual features of the Invention, to be regarded independently of one another, which in each case also develop the Invention independently of one another and thus are also to be regarded individually or in a combination other than the one shown as part of the invention. Furthermore, the described forms of embodiment can also be supplemented by further of the already described features of the invention.

The same reference characters have the same meaning in the various figures.

FIG. 1 shows a schematic cross-sectional representation of a first form of embodiment of a semiconductor assembly 2 comprising a first semiconductor element 4 which is designed as a power semiconductor module 6. The power semiconductor module 6 has a housing 7 and a plurality of power semiconductors 8, which can be designed inter alia as, in particular vertical, transistors, e.g. as insulated gate bipolar transistors (IGBTs), or further transistor types, as well as triacs, thyristors and/or diodes. Furthermore, the power semiconductor module 6 for example comprises three contacts 10, 12, 14 which are designed as load terminals 16. The contacts 10, 12, 14 of the power semiconductor module 6 are each connected to a connection element 22, 24, 26 via a force-fit connection 18, which for example is designed as a screw connection 20. The connection elements 22, 24, 26 are designed as busbars 28, which are arranged one above the other and insulated from one another in a vertical direction v. The busbars 28 are made from an electrically conductive material, in particular a metallic material, and are configured for electrically conductive contacting of the power semiconductors 8 in the power semiconductor module 6. For example, the busbars 28 contain copper, aluminum, silver, gold, tin or an alloy thereof. For example, the heat arising due to the operation of the power semiconductors 8 in the power semiconductor module 6 is dissipated to the surrounding area, in particular to the surrounding air, via thermal conduction, thermal radiation and/or convection.

The connection elements 22, 24, 26 each have a cooling channel structure 30 with at least one cooling channel 32. A heat transfer fluid 34 is arranged in the cooling channel structure 30, and is intended for two-phase cooling. For example, a thermosiphon, a heat pipe or pulsating heat pipe Is formed with the cooling channel structure 30, so that an improved heat transfer and a heat splay is achieved. For reasons of clarity, an opening for filling the cooling channel structure 30 is not shown in FIG. 1. The second connection element 24 and the third connection element 26 of the connection elements 22, 24, 26 arranged one above the other each have a cover plate 36, via which the connection to the respective contacts 12, 14 of the power semiconductor module 6 is produced by means of a screw connection 20, wherein at least one cooling channel 32 of the cooling channel structure 30 is arranged so as to run through the respective cover plate 36.

The cooling channel 32 of the cooling channel structure 30 is produced by means of an FSC method. Such an FSC method (Friction Stir Channeling) is a development of friction stir welding, in which the friction stir method is modified so that the material is intentionally moved out of the mass of the workpiece, thereby forming a channel. A cooling channel 32 produced by means of the FSC method can inter alia have an angular, in particular rectangular or square cross-section. Cooling channels can be produced easily and economically using such an FSC method.

Figure 2:
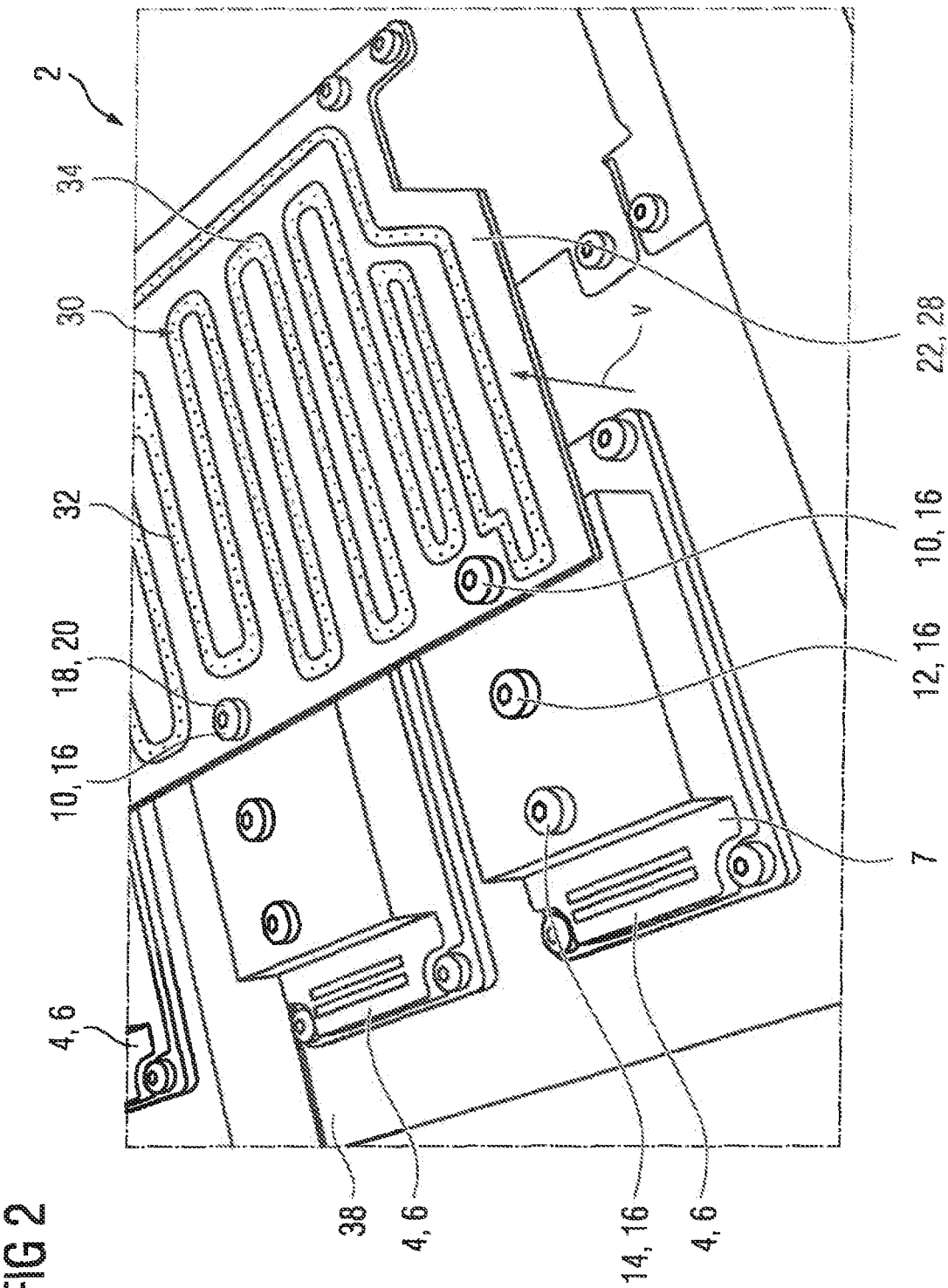
FIG. 2 shows a schematic three-dimensional representation of a second form of embodiment of a semiconductor assembly.

FIG. 2 shows a schematic three-dimensional representation of a second form of embodiment of a semiconductor assembly 2 which comprises further, for example parallel-connected, power semiconductor modules 6 which are screwed onto a common heat sink 38 and are at least thermally conductive. The first contacts 10 of the power semiconductor modules 6 are contacted via a common first connection element 22 which is designed as a busbar. The contact is produced via a screw connection 20. The cooling channel 32 of the closed cooling channel structure 30 is arranged to run in a meandering pattern in the first connection element 22 and contains a heat transfer fluid 34, wherein the cooling channel structure 30 is designed with the heat transfer fluid 34 as a pulsating heat pipe. Heat arising during operation of the power semiconductor modules 6 is dissipated to the surrounding area, in particular to the surrounding air, for example via thermal conduction, thermal radiation and/or convection. The further configuration of the semiconductor assembly 2 in FIG. 2 corresponds to that in FIG. 1.

FIG. 3 shows a schematic three-dimensional representation of a third form of embodiment of a semiconductor assembly 2 which additionally has a common second connection element 24 which is designed as a busbar. The common second connection element 24, which is arranged in a vertical direction v via the common first connection element 22, is connected to the second contacts 12 of the power semiconductor modules 6 via cover plates 36 and a screw connection 20. The cooling channel 32 of the closed cooling channel structure 30 of the second connection element 24 is arranged to run in a meandering pattern in the second connection element 24 and contains a heat transfer fluid 34, wherein the cooling channel structure 30 containing the heat transfer fluid 34 is designed as a pulsating heat pipe. The further configuration of the semiconductor assembly 2 in FIG. 3 corresponds to that in FIG. 2.

FIG. 4 shows a schematic representation of a first form of embodiment of a busbar 28 in a plan view, wherein the busbar 28 is designed as a busbar with for example three cover plates 36. The for example three closed cooling channels 32 of the cooling channel structure 30 are designed to run in the cover plates 36 and can inter alia form a heat pipe or a thermosiphon. The cooling channels 32 produced by means of the FSC method each have an opening 40 produced by means of the FSC method, which is closed after the cooling channels 32 have been filled with the heat transfer fluid 34. The further configuration of the busbar 28 in FIG. 4 corresponds to that in FIG. 3.

FIG. 5 shows a schematic representation of a second form of embodiment of a busbar 28 in a plan view. The cooling channel 32 of the closed cooling channel structure 30 is arranged to run in a meandering pattern in the busbar 28 and runs through the for example three cover plates 36. The cooling channel 32 produced by means of the FSC method has an opening 40 produced by means of the FSC method, which is closed after the cooling channel 32 has been filled with the heat transfer fluid 34. The cooling channel structure 30 arranged to run in a meandering pattern forms a pulsating heat pipe with the heat transfer fluid 34. The further configuration of the busbar 28 in FIG. 5 corresponds to that in FIG. 4.

FIG. 6 shows a schematic representation of a third form of embodiment of a busbar 28 in a plan view. One of the for example three open cooling channels 32 of the cooling channel structure 30 is formed by way of example to run through one of the three cover plates 36. Furthermore, the cooling channels 32 each have fluid terminals 42 arranged on both sides for the external supply of a heat transfer fluid 34.

FIG. 7 shows a schematic cross-sectional representation of a fourth form of embodiment of a semiconductor assembly 2, wherein the semiconductor element 4 is designed as a power semiconductor 8 which is arranged between a first substrate 44 and a second substrate 46 and is connected to the substrates 44, 46 in a material-bonded manner. The material-bonded connection can inter alia be a soldered connection and/or a sintered connection as well as an adhesive connection, e.g. using an electrically and thermally conductive adhesive. The substrates 44, 46 each have a dielectric material layer 48, a first metallization 50 arranged on a side facing toward the semiconductor element 4 and a second metallization 52 arranged on a side facing away from the semiconductor element 4. The dielectric material layer 48 can inter alia contain a ceramic material, for example aluminum nitride or aluminum oxide, or an organic material, for example a polyamide or epoxy resin.

The power semiconductor 8 is for example designed as a vertical power transistor, in particular as an insulated gate bipolar transistor (IGBT). The power transistor is connected to the first metallization 50 of the second substrate 46 via a first contact 10 which is designed as a load terminal 16, in particular as a collector terminal. On a side opposite the first contact 10 the power transistor is connected to the first metallization 50 of the first substrate 44 via a second contact 12 which is designed as a load terminal 16, in particular as an emitter terminal, and a third contact 14 which is designed as a control terminal, in particular as a gate terminal.

The first connection element 22 is electrically conductively connected to the third contact 14 via the first metallization 50 of the first substrate 44, while the second connection element 24 is electrically conductively connected to the second contact 12 of the power semiconductor 8 via the first metallization 50 of the first substrate 44. Furthermore, the connection elements 22, 24 are provided for the mechanical and thermal connection of the substrates 44, 46. The connection elements 22, 24 are additionally made from an electrically conductive material, in particular a metallic material, and are configured for the electrically conductive connection of the first substrate 44 to the second substrate 46. Thus the connection elements 22, 24 inter alia have the function of a contacting and support element. A potting material 54, in which the semiconductor component 4 and the connection elements 22, 24 are embedded, is arranged between the substrates 44, 46.

The connection elements 22, 24, which inter alia can be designed to be cuboid, each have a closed cooling channel structure 30, each with a cooling channel 32 running in a meandering pattern in the respective connection element 22, 24. The cooling channel 32 of the cooling channel structure 30 is produced by means of an FSC method. A heat transfer fluid 34 is arranged in the cooling channel 32, and is provided for two-phase cooling. The cooling channel 32, designed to run in a meandering pattern, of the cooling channel structure 30 forms with the heat transfer fluid 34 a pulsating heat pipe. The further configuration of the semiconductor assembly 2 in FIG. 7 corresponds to that in FIG. 1.

Figure 8:
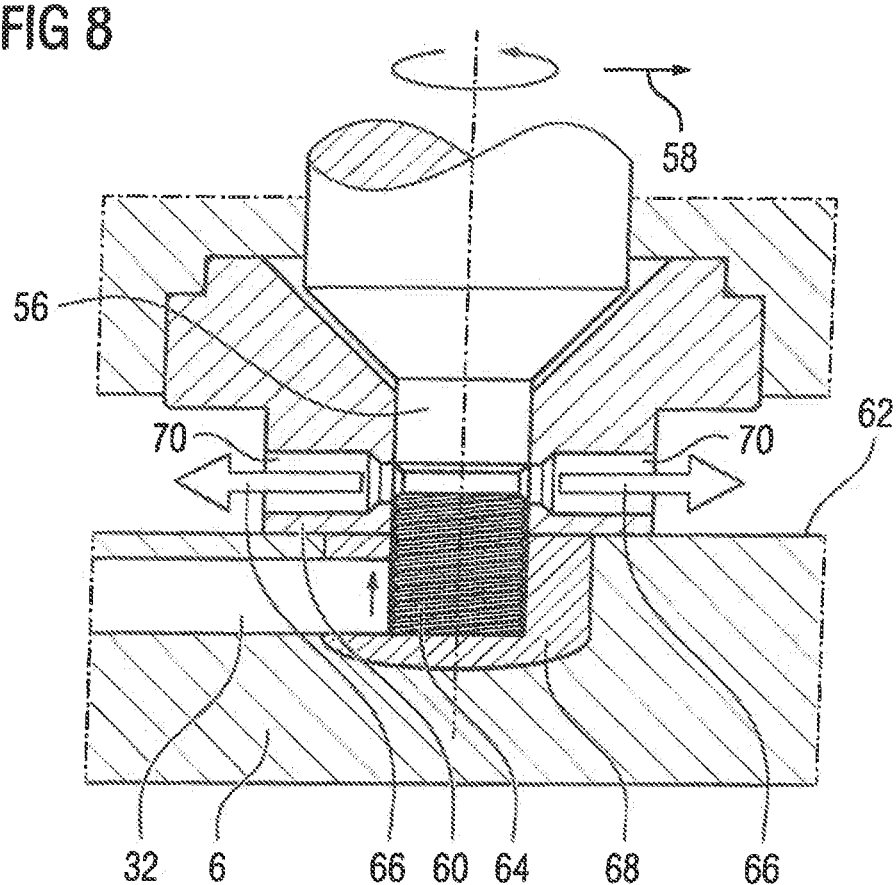
FIG. 8 shows a schematic representation of the production of a cooling channel in a connection element by means of an FSC method and FIG. 9 shows a schematic representation of a power converter.

FIG. 8 shows a schematic representation of the production of a cooling channel 32 in a connection element 22 by means of an FSC method. A rotating probe 56 is plunged into the connection element 22 and is moved in a direction of movement 58, wherein a shoulder 60 touches a surface 62 of the connection element 22. Due to the rotational movement of a thread-like profiled rotating pin 64, the metallic material of the connection element 22 is plasticized. An extrusion 66 of part of the plasticized material 68 takes place, via at least one extrusion opening 70. This material subtraction results in the formation of the closed cooling channel 32 running under the surface 62.

Figure 9:
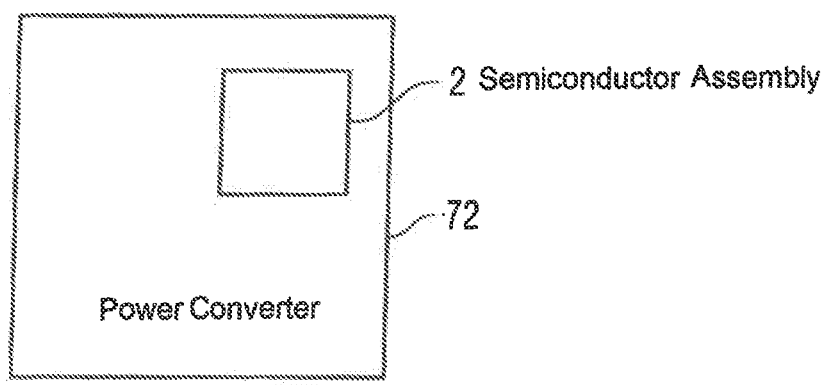

FIG. 9 shows a schematic representation of a power converter 72 which for example comprises a semiconductor assembly 2.

In summary, the invention relates to a semiconductor assembly 2 comprising a semiconductor element 4 and at least one connection element 22, 24, 26, wherein the semiconductor element 4 has at least one contact 10, 12, 14, wherein at least one connection element 22, 24, 26 is connected to a contact 10, 12, 14 of the semiconductor element 4. In order to economically and easily improve the cooling of the semiconductor assembly 2, it is proposed that the connection element 22, 24, 26 has a cooling channel structure 30 with at least one cooling channel 32 which is produced at least partially by means of an FSC method.

The invention claimed is:

1. A semiconductor assembly, comprising:
    a semiconductor element designed as a power semiconductor module and comprising a contact; and
    a connection element designed as a busbar which is connected to the contact of the power semiconductor module via a force-fit connection, in particular a screw connection, the busbar including a cover plate and a closed cooling channel structure with a cooling channel which is produced at least partially by an FSC (Friction Stir Channeling) method and arranged to run through the cover plate.

2. The semiconductor assembly of claim 1, wherein the connection element is made from an electrically conductive material, in particular a metallic material, and is configured for electrically conductive contacting of the contact.

3. The semiconductor assembly of claim 1, wherein the cooling channel of the cooling channel structure is arranged to run in a meandering pattern in the connection element.

4. The semiconductor assembly of claim 1, wherein the cooling channel structure contains a heat transfer fluid.

5. The semiconductor assembly of claim 4, wherein the heat transfer fluid is provided for two-phase cooling.

6. The semiconductor assembly of claim 4, wherein the cooling channel includes an opening which is produced by the FSC method and is configured for introduction of the heat transfer fluid.

7. A power converter, comprising the semiconductor assembly as set forth in claim 1.

8. A semiconductor assembly, comprising:
    a first substrate;
    a second substrate;
    a semiconductor element comprising a contact and designed as a power semiconductor arranged between the first substrate and the second substrate and at least connected to the first substrate, in particular in a material-bonded manner; and
    a connection element connected to the contact of the power semiconductor via the first substrate and including a closed cooling channel structure with a cooling channel which is produced at least partially by an FSC (Friction Stir Channeling) method,
    wherein the power semiconductor is in thermally conductive connection with the connection element via the first substrate.

9. The semiconductor assembly of claim 8, wherein the connection element is made from an electrically conductive material, in particular a metallic material, and is configured for electrically conductive contacting of the contact.

10. The semiconductor assembly of claim 8, wherein the cooling channel of the cooling channel structure is arranged to run in a meandering pattern in the connection element.

11. The semiconductor assembly of claim 8, wherein the cooling channel structure contains a heat transfer fluid.

12. The semiconductor assembly of claim 11, wherein the heat transfer fluid is provided for two-phase cooling.

13. The semiconductor assembly of claim 11, wherein the cooling channel includes an opening which is produced by the FSC method and is configured for introduction of the heat transfer fluid.

14. The semiconductor assembly of claim 8, wherein the connection element is designed for mechanical and/or thermal connection of the first and second substrates.

15. The semiconductor assembly of claim 8, wherein the connection element is made from an electrically conductive material, in particular a metallic material, and is configured for electrically conductive connection of the first substrate to the second substrate.

16. A power converter, comprising the semiconductor assembly as set forth in claim 8.

17. A method for producing a semiconductor assembly, the method comprising:
    designing a semiconductor element as a power semiconductor module;
    designing a connection element as a busbar;
    producing in the busbar a closed cooling channel structure with at least one cooling channel at least partially by an FSC (Friction Stir Channeling) method such that the cooling channel of the cooling channel structure is arranged to run through a cover plate of the busbar; and
    connecting the busbar to a contact of the power semiconductor module via a force-fit connection, in particular a screw connection.

18. The method of claim 17, further comprising designing the cooling channel of the cooling channel structure to run in a meandering pattern in the connection element.

19. The method of claim 17, further comprising introducing a heat transfer fluid provided for two-phase cooling into the cooling channel structure.

20. The method of claim 17, further comprising producing by the FSC method an opening in the cooling channel for introduction of a heat transfer fluid.

21. A method for producing a semiconductor assembly, the method comprising:
- designing a semiconductor element as a power semiconductor;
- arranging the power semiconductor module between a first substrate and a second substrate;
- connecting the power semiconductor at least to the first substrate, in particular in a material-bonded manner;
- designing a connection element with a closed cooling channel structure with a cooling channel produced at least partially by an FSC (Friction Stir Channeling) method;
- connecting the connection element to a contact of the power semiconductor via the first substrate; and
- thermally conductively connecting the power semiconductor to the connection element via the first substrate.

22. The method of claim 21, further comprising designing the cooling channel of the cooling channel structure to run in a meandering pattern in the connection element.

23. The method of claim 21, further comprising introducing a heat transfer fluid provided for two-phase cooling into the cooling channel structure.

24. The method of claim 21, further comprising producing by the FSC method an opening in the cooling channel for introduction of a heat transfer fluid.

* * * * *